United States Patent
Oo et al.

(10) Patent No.: US 9,077,364 B2
(45) Date of Patent: *Jul. 7, 2015

(54) METHOD AND APPARATUS FOR CONVERTING AN ANALOG SIGNAL TO A DIGITAL SIGNAL BASED ON REFERENCE VOLTAGES PROVIDED BY REFERENCE LADDERS

(71) Applicant: Marvell World Trade LTD., St. Michael (BB)

(72) Inventors: Kenneth Thet Zin Oo, Milpitas, CA (US); Pierte Roo, Sunnyvale, CA (US); Xiong Liu, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/291,204

(22) Filed: May 30, 2014

(65) Prior Publication Data

US 2014/0266846 A1    Sep. 18, 2014

Related U.S. Application Data

(63) Continuation of application No. 13/323,527, filed on Dec. 12, 2011, now Pat. No. 8,742,969, which is a continuation of application No. 12/684,735, filed on Jan. 8, 2010, now Pat. No. 8,077,069.

(60) Provisional application No. 61/145,840, filed on Jan. 20, 2009.

(51) Int. Cl.
H03M 1/14    (2006.01)
H03M 1/10    (2006.01)
H03M 1/06    (2006.01)
H03M 1/12    (2006.01)
H03M 1/36    (2006.01)
H03M 1/16    (2006.01)

(52) U.S. Cl.
CPC .............. *H03M 1/14* (2013.01); *H03M 1/1014* (2013.01); *H03M 1/167* (2013.01); *H03M 1/06* (2013.01); *H03M 1/124* (2013.01); *H03M 1/36* (2013.01)

(58) Field of Classification Search
CPC ........ H03M 1/14; H03M 1/142; H03M 1/145
USPC ........................................................ 341/156
See application file for complete search history.

(56) References Cited

U.S. PATENT DOCUMENTS

| | | |
|---|---|---|
| 3,597,761 A | 8/1971 | Fraschilla et al. |
| 4,733,217 A | 3/1988 | Dingwall |
| 4,999,631 A | 3/1991 | Sugimoto |

(Continued)

*Primary Examiner* — Howard Williams

(57) ABSTRACT

A circuit including first and second reference ladders, a selection circuit, first and second analog to digital converters (ADCs), and a summer. The first reference ladder is configured to provide first reference voltages via first taps. The selection circuit is configured to select one of the first reference voltages. The second reference ladder is configured to, based on the selected one of the first reference voltages, provide second reference voltages via second taps. The first ADC is configured to convert the first version of the analog input signal to a first digital signal. The second ADC is configured to, based on the second reference voltages, convert the second version of the analog input signal to a second digital signal. The summer is configured to generate a digital output signal based on the first and second digital signals.

20 Claims, 9 Drawing Sheets

(56) References Cited

U.S. PATENT DOCUMENTS

| | | | |
|---|---|---|---|
| 5,099,240 A | 3/1992 | Nakatani et al. | |
| 5,111,205 A | 5/1992 | Morlon | |
| 5,184,130 A * | 2/1993 | Mangelsdorf | 341/156 |
| 5,450,085 A * | 9/1995 | Stewart et al. | 341/159 |
| 5,471,208 A | 11/1995 | Sauer | |
| 5,534,864 A * | 7/1996 | Ono et al. | 341/156 |
| 5,703,588 A | 12/1997 | Rivoir et al. | |
| 5,867,116 A | 2/1999 | Nakamura et al. | |
| 6,570,523 B1 | 5/2003 | Bacrania et al. | |
| 6,628,216 B2 | 9/2003 | Chen et al. | |
| 6,956,512 B1 | 10/2005 | San et al. | |
| 7,046,179 B1 | 5/2006 | Taft et al. | |
| 7,119,730 B2 | 10/2006 | San et al. | |
| 7,215,274 B2 | 5/2007 | Liu | |
| 7,312,741 B2 | 12/2007 | Nakajima | |
| 7,321,327 B1 | 1/2008 | San et al. | |
| 7,358,876 B1 | 4/2008 | Oo et al. | |
| 7,379,010 B2 | 5/2008 | Tero | |
| 7,978,105 B2 | 7/2011 | Oo | |
| 8,049,652 B2 | 11/2011 | Oo | |
| 2004/0155807 A1 | 8/2004 | van der Goes et al. | |

* cited by examiner

METHOD AND APPARATUS FOR CONVERTING AN ANALOG SIGNAL TO A DIGITAL SIGNAL BASED ON REFERENCE VOLTAGES PROVIDED BY REFERENCE LADDERS

CROSS REFERENCE TO RELATED APPLICATIONS

The present disclosure is a continuation of U.S. application Ser. No. 13/323,527 (now U.S. Pat. No. 8,742,969), filed Dec. 12, 2011, which is a continuation of U.S. patent application Ser. No. 12/684,735 (now U.S. Pat. No. 8,077,069), filed on Jan. 8, 2010. This application claims the benefit of U.S. Provisional Application No. 61/145,840, filed on Jan. 20, 2009. The entire disclosures of the applications referenced above are incorporated herein by reference.

The present application is related to co-pending U.S. patent application Ser. No. 12/684,773 entitled "Current Sensing and Background Calibration to Match Two Resistor Ladders", filed concurrently, and co-pending U.S. patent application Ser. No. 12/684,760 entitled "Reference Pre-Charging for Two-Step Subranging ADC Architecture", both filed concurrently, the contents of both are incorporated herein in their entirety for all purposes.

BACKGROUND

Particular embodiments generally relate to analog-to-digital (ADC) architectures and more specifically to two-step subranging ADC architectures.

A two-step subranging ADC architecture performs an analog-to-digital conversion in two steps. FIG. 1 depicts a conventional two-step subranging ADC architecture 100. Architecture 100 includes a coarse ADC 102 and a fine ADC 104. Coarse ADC 102 includes a coarser or poorer resolution than fine ADC 104 and can quickly determine an approximate subrange that a sample of an input analog signal falls within. This narrows the range of analog voltages in which the sample of the input analog signal may correspond. Fine ADC 104 then further defines the analog voltage from within the subrange selected by coarse ADC 102.

The input analog signal is received at a track-and-hold stage (T/H) 106. Track-and-hold stage 106 tracks the input analog signal and stores an input voltage for the sample of the input analog signal. For example, the input analog signal may be sampled for a half clock cycle and the input voltage from the sample is stored for another half clock cycle.

Coarse ADC 102 compares the stored voltage to a plurality of coarse references received from a reference ladder 108. Reference ladder 108 may include a plurality of tap points. Each tap point may be at a different voltage level for each coarse reference. Coarse ADC 102 performs a first comparison of the input voltage to the coarse references to determine a subrange in which the input voltage falls within.

A result of the first comparison is then used to select finer references or finer subdivisions of the selected subrange for fine ADC 104. For example, certain switches in a switch matrix 110 are closed to provide a second subrange of fine references to fine ADC 104. Fine ADC 104 then performs a second comparison of the fine references and the input voltage.

Encoding and digital correction logic 112 uses the results of the first comparison and the second comparison to determine a first digital code and a second digital code. The first and second digital codes are used to determine a digital output for the sample of the input analog signal. For example, the first and second digital codes may be appropriately weighted, error corrected, and combined to generate the digital output, which may be a digital representation of the sample of the input analog signal.

The determination of the first digital code and second digital code each needs to be made within a half clock period, T/2, where T is a clock period. When the sampling rate goes up, the time that coarse ADC 102 needs to make a decision becomes a larger part of its half clock period T/2.

Reference ladder 108 needs time to settle from a voltage level of a previous sample to set up the fine references. FIG. 2 shows a timing diagram for the conventional two-step subranging architecture 100. At each clock cycle, the input analog signal is tracked (T) and held (H). During the hold period, coarse ADC 1-102 makes its decision within a portion of the T/2 period. Then, in the remaining part of the same T/2 period, coarse output encoding, fine reference selection and subsequent setting of the fine reference takes place. When the sampling rate goes up, coarse output encoding, fine reference selection and subsequent setting of the fine reference combined together take a longer part of the T/2 period, which means less time for reference settling is allotted.

The reference settling problem is discussed in more detail in FIG. 3, which shows a more detailed conventional architecture for a two-step subranging ADC. Reference ladder 1-108 includes a plurality of reference segments 202a-202n. Each reference segment includes a coarse tap 204 to coarse ADC 1-102. Coarse taps 204a-204n provide the coarse references to coarse ADC 1-102. Also, each reference segment 202 includes a plurality of fine taps 206 to provide fine references. When coarse ADC 1-102 makes a coarse decision, switch matrix 1-110 selects a reference segment 202. The selected fine references associated with the selected reference segment 202 are then input into fine ADC 1-104 through switch matrix 1-110.

When the two-step subranging ADC architecture 1-100 is running at very high sampling rates, the maximum conversion rate is limited by the reference settling speed of reference ladder 1-108. Reference settling becomes a speed bottleneck due to loading from a large number of switches in switch matrix 1-110 and comparators in coarse ADC 1-102 or fine ADC 1-104. These loadings dynamically disturb the voltage levels of reference ladder 1-108 decreasing the bandwidth of reference ladder 1-108 and causing a longer settling time. The speed bottleneck becomes a problem as both ADC resolution and conversion rate become higher. To lower the reference settling time, each reference segment 202 may be designed with a very small resistance value. However, designing reference segments with the small resistance value takes up a very large chip area. Also, the resistors of reference segments 202 have their own parasitic capacitance, which limits the return on the lower resistance values.

SUMMARY

In one embodiment, an analog-to-digital converter is provided. A first track and hold stage tracks and stores an input voltage for a sample of an analog input signal. A coarse reference ladder provides a plurality of coarse references. In one embodiment, the coarse reference ladder includes a first coarse reference ladder including a plurality of first taps to provide a plurality of coarse references and a second coarse reference ladder including a plurality of second taps to provide the plurality of coarse references.

A coarse analog-to-digital converter (ADC) receives the input voltage from the first track and hold stage and the plurality of coarse references. The coarse ADC performs a first comparison of the input voltage and the plurality of coarse references and outputs a coarse output based on the first comparison. A switch matrix includes a plurality of switches and is configured to close a switch corresponding to a coarse reference based on the coarse output.

A second track and hold stage tracks and stores the input voltage. A fine reference ladder receives the coarse reference from the coarse reference ladder and provides a plurality of fine references. The plurality of fine references are determined based on the coarse reference. A fine ADC receives the input voltage from the second track and hold stage and the plurality of fine references. The fine ADC performs a second comparison of the input voltage and the plurality of fine references and outputs a fine output based on the second comparison. Logic outputs a digital output for the sample of the analog input signal based on the coarse output and the fine output.

In one embodiment, an apparatus is provided that comprises: a first track and hold stage configured to track and store an input voltage for a sample of an analog input signal; a coarse reference ladder providing a plurality of coarse references; a coarse analog-to-digital converter (ADC) configured to receive the input voltage from the first track and hold stage and the plurality of coarse references, the coarse ADC configured to perform a first comparison of the input voltage and the plurality of coarse references and output a coarse output based on the first comparison; a switch matrix including a plurality of switches, the switch matrix configured to close a switch based on the coarse output, the switch corresponding to a coarse reference; a second track and hold stage configured to track and store the input voltage; a fine reference ladder configured to receive the coarse reference and provide a plurality of fine references determined based on the coarse reference; a fine ADC configured to receive the input voltage from the second track and hold stage and the plurality of fine references, wherein the fine ADC is configured perform a second comparison of the input voltage and the plurality of fine references and output a fine output based on the second comparison; and logic configured to output a digital output for the sample of the analog input signal based on the coarse output and the fine output.

In another embodiment, an apparatus is provided that comprises: a coarse reference ladder comprising: a first coarse reference ladder including a plurality of first taps to provide a first plurality of coarse references; and a second coarse reference ladder including a plurality of second taps to provide a second plurality of coarse references; a coarse analog-to-digital converter (ADC) configured to receive an input voltage of a sample of an analog input signal and the first plurality of coarse references, the coarse ADC configured to perform a first comparison of the input voltage and the first plurality of coarse references and output a coarse output based on the first comparison; a switch matrix including a plurality of switches, the switch matrix configured to close a switch for a second tap based on the coarse output, the switch corresponding to a second coarse reference; a fine reference ladder configured to receive the coarse reference and output a plurality of fine references from a plurality of third taps of the fine reference ladder, the plurality of fine references determined based on the coarse reference; a fine ADC configured to receive the input voltage and the plurality of fine references from the plurality of third taps, wherein the fine ADC is configured perform a second comparison of the input voltage and the plurality of fine references and output a fine output based on the second comparison; and logic configured to output a digital output for the sample of the analog input sample based on the coarse output and the fine output.

The following detailed description and accompanying drawings provide a better understanding of the nature and advantages of the present invention.

DETAILED DESCRIPTION

Described herein are techniques for a two-step subranging analog-to-digital converter (ADC) architecture. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Overview of ADC Architecture

Figure 4:
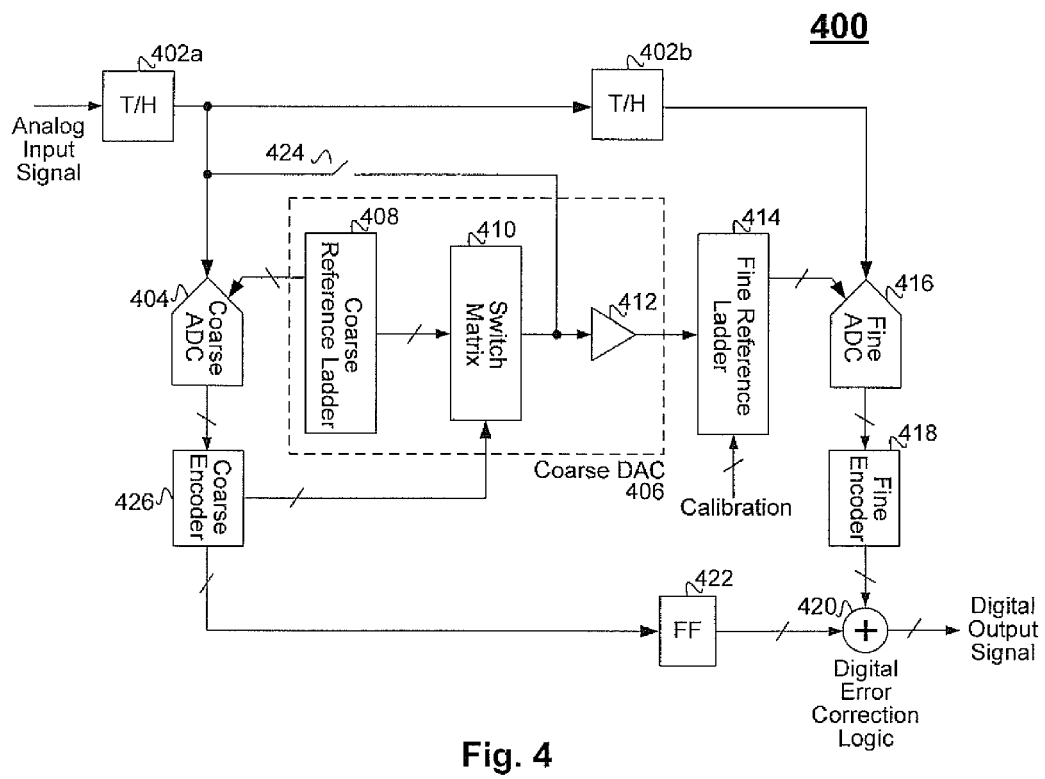
FIG. 4 depicts an analog-to-digital converter architecture according to one embodiment.

FIG. 4 depicts an ADC architecture 400 according to one embodiment. In one embodiment, architecture 400 is used for ultra high-speed, medium-to-high resolution applications. Although these applications are described, architecture 400 may be used in other applications that require an analog-to-digital conversion. In one embodiment, architecture 400 is a two-step subranging ADC architecture.

Architecture 400 converts an analog input signal to a digital output signal. The analog input signal is received at a first track-and-hold stage (T/H) 402a. Track-and-hold stage 402a is configured to track the analog input signal for a part of a clock cycle, T, and store an input voltage for another part of the clock cycle. For example, the analog input signal may be tracked for T/2 and the input voltage is stored for another T/2. The stored input voltage is for a sample of the analog input signal.

A coarse ADC 404 receives the input voltage and performs a comparison of the input voltage to a plurality of coarse references received from a coarse digital-to-analog converter (DAC) 406.

In one embodiment, coarse DAC 406 includes a coarse reference ladder 408, a switch matrix 410, and a buffer 412. Coarse reference ladder 408 is separated from a fine reference ladder 414 through buffer 412. The separation allows for independent optimization of coarse reference ladder 408 and fine reference ladder 414, which will be described in more detail below.

Coarse reference ladder 408 may include a plurality of resistors and a plurality of taps. The plurality of taps provide the plurality of coarse references to coarse ADC 404. The coarse references may be different reference voltage levels.

Figure 5:
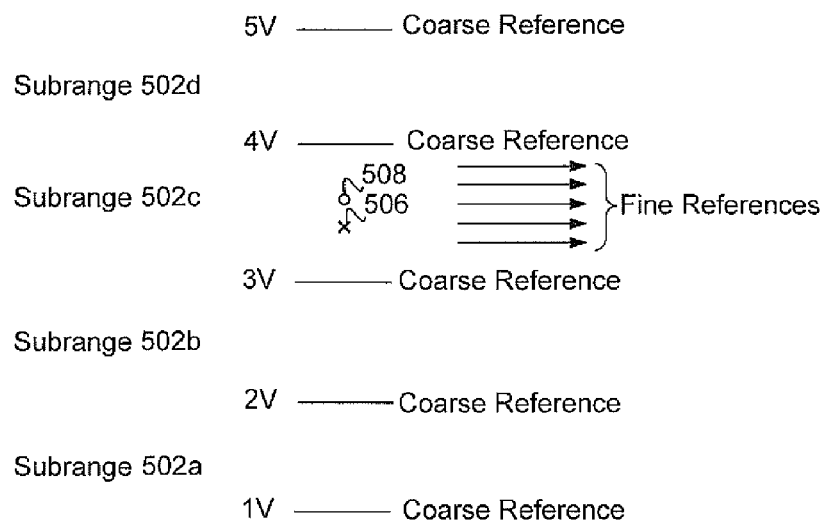
FIG. 5 shows a conceptual example of the subranges according to one embodiment.

Coarse ADC 404 compares the input voltage to the coarse references to determine a coarse decision. The coarse decision may select a coarse reference for a subrange in which the input voltage resides. For example, coarse ADC 404 may choose a midpoint in between a subrange of voltages. FIG. 5 shows a conceptual example of the subranges according to one embodiment. A plurality of subranges 502a-502d are shown and a plurality of coarse references are provided. For example, the coarse references may be 1-5V. Coarse ADC 4-404 compares the input voltage to coarse references and selects which range of values in which the input voltage resides. For example, the input voltage may reside at a point 506 in subrange 502c. Coarse ADC 4-404 then selects subrange 502c. The voltage selected may be a midpoint 508 in subrange 502c. By selecting the midpoint, a slight quantization error, $E_q$ is introduced. As will be explained below, the fine references are used to refine the quantization error using the fine references.

Referring back to FIG. 4, the coarse decision is the result of comparisons between the input voltage and the coarse references. For example, comparators in coarse ADC 404 may compare the input voltage with the different coarse references. Each comparator outputs a logic output based upon the comparison. The value of the logic output is based on whether the coarse reference is higher or lower than the input voltage. For example, a comparator may output a value of 0 if the input voltage has a value that is lower than the coarse reference. Also, a comparator outputs a "1" value if the input voltage has a value higher than the coarse reference. A coarse encoder 414 receives the logic output from the comparators and determines a first digital code. The first digital code is a digital representation of the input voltage.

A switch in switch matrix 410 is closed such that a coarse reference for subrange 5-502 selected by coarse ADC 404 is sent to fine reference ladder 414 through buffer 412. Buffer 412 separates coarse reference ladder 408 from fine reference ladder 414.

The coarse reference is sent to fine reference ladder 414. Fine reference ladder 414 uses the coarse reference to generate a plurality of fine references for a fine ADC 416. The plurality of fine references may be within the subrange selected by coarse ADC 404. For example, referring to FIG. 5, a plurality of fine references are provided in between 3V-4V. A fine reference corresponding to the input voltage is then determined.

Fine ADC 416 receives the plurality of fine references and an input voltage from second track-and-hold stage 402b. For example, second track-and-hold stage 402b tracks the input voltage starting at a T/2 period after the tracking period for first track-and-hold stage 402a and stores the input voltage starting at a T/2 period after the storing period for first track-and-hold stage 402a. By using two track-and-hold stages 402a and 402b, the fine ADC decision may be extended an extra T/2 period. This allows an extended settling time for coarse reference ladder 408 and fine reference ladder 414. This concept will be described in more detail below.

Referring back to FIG. 4, fine ADC 416 compares the fine references to the input voltage. In one embodiment, comparators of fine ADC 416 output logic outputs of comparisons of the fine references and the input voltage. For example, a 0 or 1 may be output depending on the comparison. A comparator may output a value of 0 if the input voltage has a value that is lower than the reference. Also, a comparator outputs a "1" value if the input voltage has a value higher than the reference.

A fine encoder 418 receives the logic outputs of the comparison and determines a second digital code. The second digital code is a digital representation of the input voltage.

Digital error correction logic 420 receives the first digital code from coarse encoder 414 and the second digital code from fine encoder 418. The first digital code may be received through a flip-flop 422. Flip-flop 422 may delay the first digital code because of the decision by fine ADC 416 being delayed by a T/2 period.

Digital error correction logic 420 may include an adder. The adder may add the first digital code and the second digital code to produce a digital output. Additionally, digital error correction logic 420 may weight and error correct the first digital code and the second digital code. In one embodiment, the first digital code may be used to determine the most significant bits (MSB) of the digital output. The second digital code may be used to refine the least significant bits (LSB) of the digital output. The digital output may be a binary code or any other type of code that represents the sample of the analog input in the digital domain.

Coarse reference ladder 408 and the use of additional track and hold stages 402a and 402b in architecture 400 will now be described in more detail. The calibration of fine reference ladder 414 and reference precharging will then be described.

Coarse Reference Ladder

Figure 6:
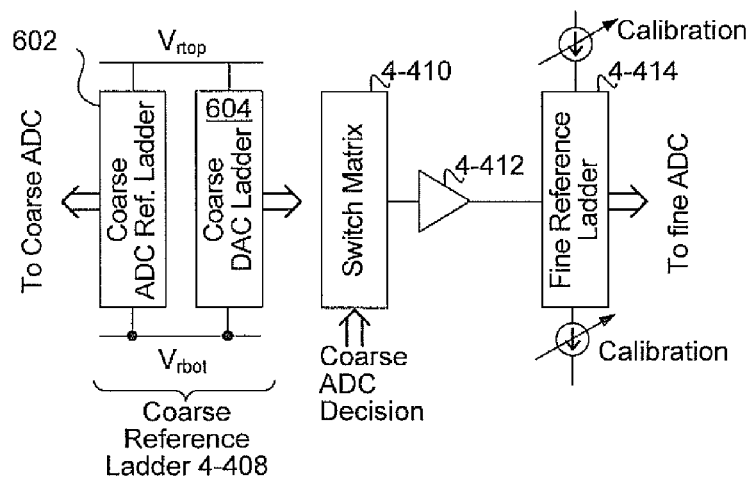
FIG. 6 depicts another example of subranging ADC reference ladders according to one embodiment.

Particular embodiments provide two reference ladders for coarse reference ladder 408. Although two coarse reference ladders are described, any number of coarse reference ladders may be used. FIG. 6 depicts another example of the subranging ADC reference ladders according to one embodiment. Coarse reference ladder 4-408 includes a coarse ADC reference ladder 602 and a coarse DAC ladder 604. By using two separate ladders, coarse DAC ladder 604 may be free of loading from comparators in coarse ADC 4-404. Additional bandwidth may be gained by coarse DAC ladder 608.

In addition to separating coarse reference ladder 4-408 into coarse ADC reference ladder 602 and coarse DAC ladder 604, fine reference ladder 4-414 is separated from coarse reference ladder 4-408 through buffer 4-412. This allows separate implementation and optimization of coarse ADC reference ladder 602, coarse DAC ladder 604, and fine reference ladder 4-414.

Coarse ADC reference ladder 602 is static. Coarse ADC reference ladder 602 provides a number of reference voltages (e.g., the coarse references) between the voltages $V_{rtop}$ and $V_{rbot}$. The reference voltages provided to coarse ADC 4-404 do not change making coarse ADC reference ladder 602 static.

Coarse DAC ladder 604 is dynamic. Each time coarse ADC 4-404 selects a different subrange, a different coarse reference is provided to fine ADC 4-416. By using two separate ladders, coarse DAC ladder 604 can settle faster from a previous voltage level to the voltage level selected as the subrange. For example, coarse DAC ladder 604 is free of loading from comparators in coarse ADC 4-404, which allows coarse DAC ladder 604 to settle faster. Additionally, coarse DAC ladder 604 may be implemented with a low impedance, high speed design in contrast to coarse ADC reference ladder 602, which may be implemented in a high impedance, slow speed design. Coarse ADC reference ladder 602 is static and may not need to be a high speed design. By using a high impedance design, coarse ADC reference ladder 602 consumes less power. However, the high speed design allows coarse DAC ladder 604 to settle faster to set up the fine references based on the subrange selected by coarse ADC 4-404.

Coarse DAC ladder 604 is also separated from fine reference ladder 4-414 by buffer 4-412. The use of buffer 4-412 instead of coarse DAC ladder 604 to drive fine reference ladder 4-414 prevents a large loading from fine ADC 4-416 on coarse DAC ladder 604. For example, loading from the comparators found in fine ADC 4-416 is prevented. This improves settling speed and slew rate of coarse DAC ladder 604.

Fine reference ladder 4-414 is dynamic because different fine references are being selected based on the subrange selected by coarse ADC 4-404. When different subranges are selected, the fine references are at different voltage levels and this causes shifts in voltage at fine reference ladder 4-414. However, because fine reference ladder 4-414 is separated from coarse DAC ladder 604 by buffer 4-412, coarse DAC ladder 604 is not disturbed by the change in voltage levels at fine reference ladder 4-414.

Fine reference ladder 4-414 may also be floating in that there may not need to be a fixed resistance ratio between fine reference segments and coarse reference segments. A reference segment may be a unit resistor between taps of coarse reference ladder 4-408 or fine reference ladder 4-414. Coarse reference ladder 4-408 or fine reference ladder 4-414 may each include multiple unit resistors that divide the ladder into the different voltage subranges. The unit resistors of floating fine reference segments may be implemented in different orientations and sizes from coarse reference ladder 4-408. Calibration is used to match unit resistors of fine reference ladder 4-414 to coarse reference ladder 4-408, which will be described below. Conventionally, a fixed resistance ratio between coarse reference ladder 4-408 and fine reference ladder 4-414 lead to ultra low resistance segments in a high-speed design if coarse reference ladder 4-408 uses low resistance segments. The very low resistance values may lead to parasitic effects. Also, physical implementation of low resistance segments may require large areas and have other process parasitics (e.g., interface and contacts resistance). Using floating fine references avoids these problems as low impedance resistors may be used but very small resistor segments can be avoided.

Fine reference ladder 4-408 may be floating, but the voltage of fine reference ladder 4-414 is a fixed ratio of the voltage for coarse reference ladder 4-408. A calibration is used to ensure that the voltage ratio is fixed between fine reference ladder 4-414 and coarse reference ladder 4-414. Accordingly, very small resistor segments that are used in coarse DAC ladder 604 do not need to be used in fine reference ladder 4-414. More details of the calibration of fine reference ladder 4-414 will be described below.

Example Implementation of ADC Architecture Using Multiple Track and Hold Stages

Figure 7:
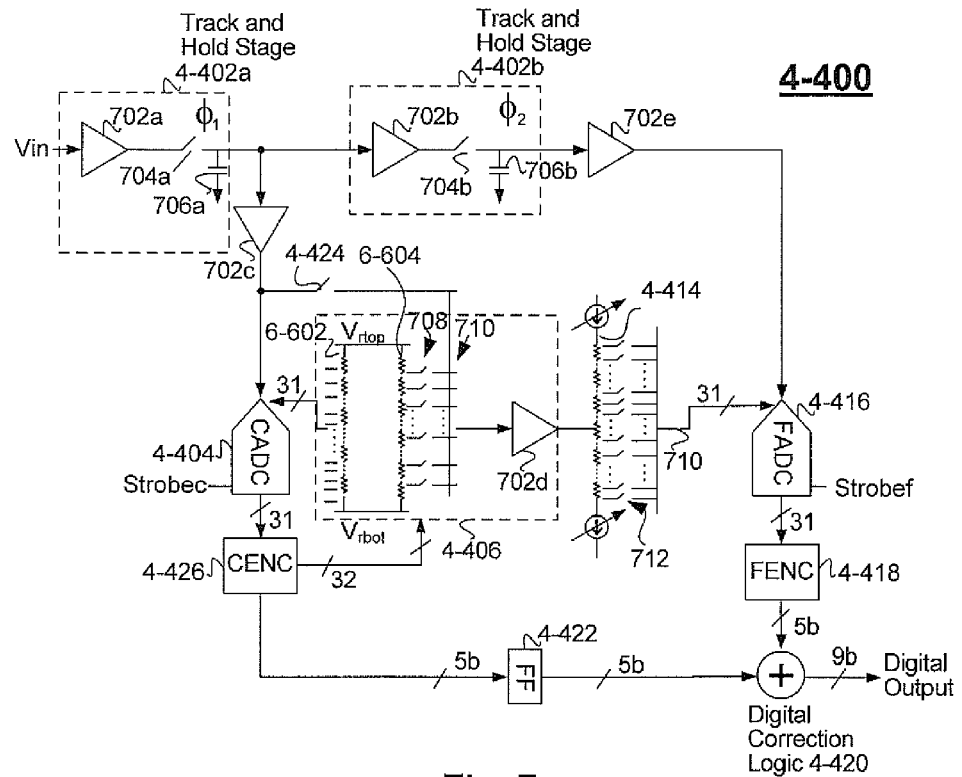
FIG. 7 depicts a more detailed example of the ADC architecture according to one embodiment.

FIG. 7 depicts a more detailed example of ADC architecture 4-400 according to one embodiment. A first track-and-hold stage 4-402a includes an amplifier 702a, a switch 704a, and a capacitor 706a. Although this implementation of track-and-hold stage 4-402a is described, other implementations may be appreciated. Capacitor 706a is used to store the input voltage. Switch 704a is toggled between the track stage and the hold stage. The switch may be closed to charge capacitor 706a and then opened when the voltage is stored.

A second track-and-hold stage includes an amplifier 702b, switch 704b, and capacitor 706b. Amplifier 702b is gain matched with amplifier 702c. The matching ensures that the input voltage that is being input into coarse ADC 4-404 is matched with the voltage being tracked and stored by track-and-hold stage 4-402b.

Coarse DAC 4-406 includes coarse ADC reference ladder 6-602 and coarse DAC ladder 6-604. Coarse DAC 4-406 and coarse DAC ladder 6-604 each include a plurality of unit resistors. 31 coarse taps of coarse ADC reference ladder 6-602 in between the unit resistors are provided to coarse ADC 4-404. However, any number of coarse taps may be used. In this case, architecture 400 may be a 9-bit resolution ADC.

Coarse ADC (CADC) 4-404 receives a clocking signal, strobec. At each clock cycle, coarse ADC 4-404 makes a coarse decision. For example, when a coarse reference is selected by coarse ADC 4-404, coarse encoder (CENC) 4-426 provides a control signal to switches 708 included in switch matrix 4-410 to close one of the switches corresponding to the coarse reference selected. In one embodiment, a 32-bit signal is sent to open or close switches 708.

The selected coarse reference is sent through a buffer 702d from coarse DAC ladder 6-604. A buffer 702e is gain matched with buffer 702d. This ensures that the input voltage into fine ADC 4-416 from buffer 702e is gain matched with the reference selected by coarse ADC 4-404.

A plurality of fine taps and a plurality of fine switches 712 are included in fine reference ladder 4-414. In one example, based on the signal received, different switches in fine reference ladder 4-414 are closed to send 31 fine references to fine ADC 4-416. Fine ADC 4-416 may also receive the input voltage from buffer 702e.

Fine ADC (FADC) 4-416 makes a fine decision at each clock cycle of a clocking signal, strobef. For example, fine ADC 4-416 outputs logic outputs from comparisons of the input voltage and the fine references. Fine encoder 4-418 uses the logic outputs to determine a second digital code. Digital correction logic 4-420 receives the second digital code and the first digital code through a flip-flop 4-422. The first digital code may be used to determine the 5 most significant bits for the digital output and the second digital code may be used to refine the 5 least significant bits of the first digital code. For example, digital correction logic 420 combines and error corrects the first digital code and second digital code into a 9-bit digital output.

Figure 1:
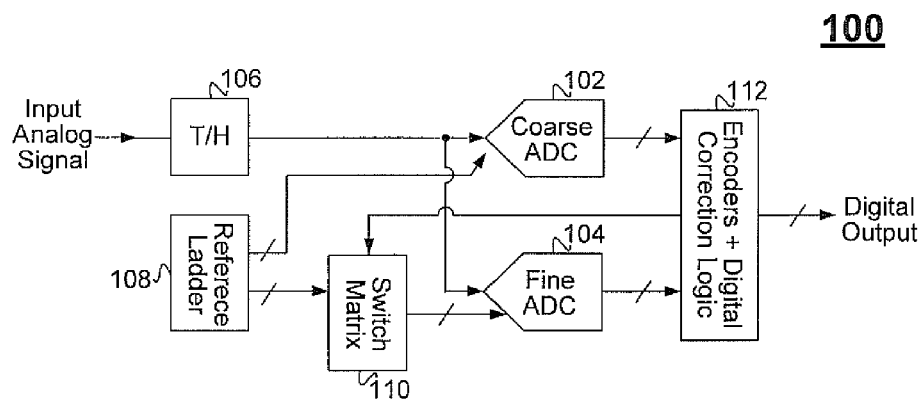
FIG. 1 depicts a conventional two-step subranging ADC architecture.
Figure 3:
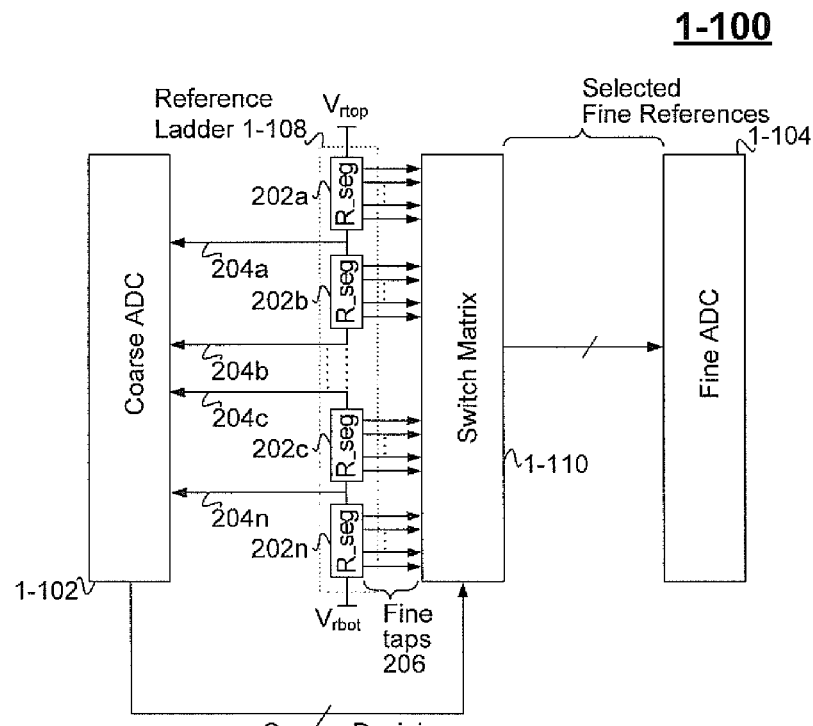
FIG. 3 shows a more detailed conventional architecture for a two-step subranging ADC.
Figure 2:
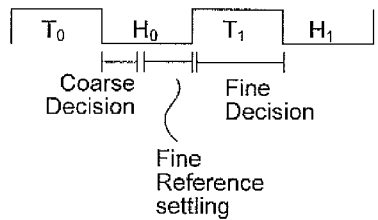
FIG. 2 shows a timing diagram for the conventional two-step subranging architecture.
Figure 8:
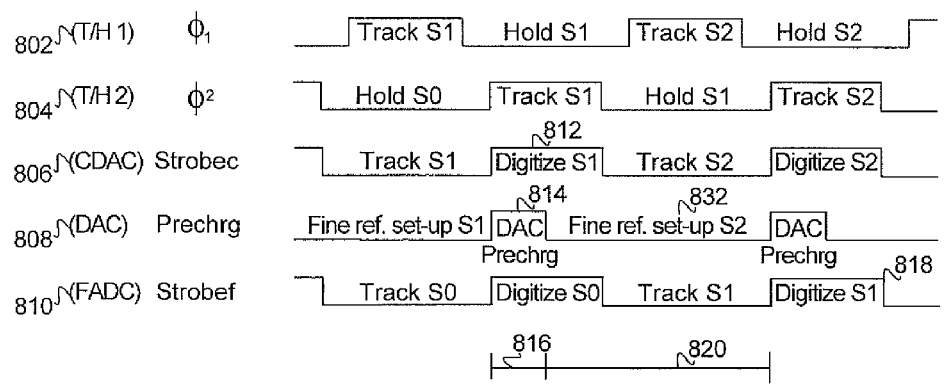
FIG. 8 depicts a timing diagram for the ADC architecture described in FIG. 7 according to one embodiment.

FIG. 8 depicts a timing diagram for architecture 4-400 described in FIG. 7 according to one embodiment. Because two track-and-hold stages 4-404a and 4-404b are used, additional time for reference settling is provided. Conventionally, as described in FIG. 3, the coarse decision, fine reference bit encoding, and fine reference settling are all are done in half of a clock cycle (T/2). However, in particular embodiments, this total time is extended by another half clock period ~T/2 to be approximately a full clock period before fine ADC 4-416 needs to start making a comparison.

At 802 and 804, the signals for first track-and-hold stage 4-404a and second track-and-hold stage 4-402b are shown. First track-and-hold stage 4-404a tracks and holds a sample for a clock period, T, and then second track-and-hold stage 4-402b tracks and holds the same sample for another clock period, T. For example, first track-and-hold stage 4-402a tracks and holds a new sample S1 and then second track-and-hold stage 4-402b tracks and holds the new sample. While first track and hold stage 4-402a is tracking the new sample S1, second track and hold stage 4-402b is holding a current sample S0. The delay in tracking and holding between first track-and-hold stage 4-402a and second track-and-hold stage 4-402b is approximately T/2.

At 806, 808, and 810, the signals for coarse ADC 4-404, coarse DAC 4-406, and fine ADC 4-416 are shown, respectively. Coarse ADC 4-404 makes a coarse decision at 812 for the sample S1. The fine references need to be set up after the coarse decision is made. That is, coarse DAC reference ladder 6-604 settles. Additionally, a precharge of the output of coarse DAC ladder 6-604 is performed at 814. A time period shown at 816 shows the time taken to make the coarse decision.

Fine ADC 4-416 then makes a fine decision for the sample S1 at 818. Thus, instead of determining the first digital code and the second digital code, respectively, within consecutive T/2 periods, the fine decision time is extended to another T/2 period. That is, the coarse decision determination starts in a first T/2 period, a second T/2 period passes, and the fine decision determination is started after the second T/2 period. As shown at 820, fine reference ladder 4-414 settles and makes the fine decision in a second time period. Fine ADC 4-416 has approximately a full clock period before fine ADC 4-416 has to start a comparison to determine the fine decision after the coarse decision determination starts. This allows the ADC conversion rate to be higher.

Calibration of Fine Reference Ladder

Figure 9:
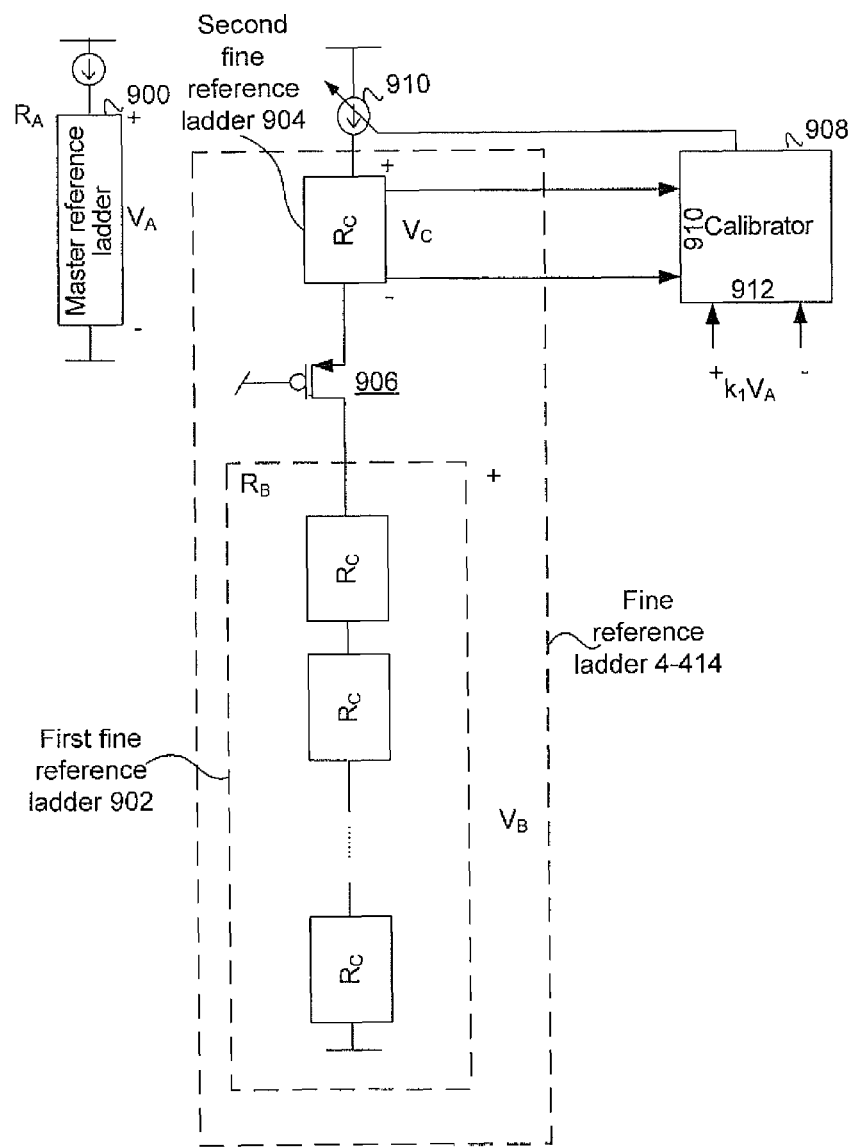
FIG. 9 depicts an example of calibration of reference ladders according to one embodiment.

FIG. 9 depicts an example of calibration of reference ladders according to one embodiment. The calibration is described with respect to coarse reference ladder 4-408 and fine reference ladder 4-414; however, it will be understood that the calibration described herein may be used with respect to other designs. For example, other designs that require multiple reference ladders may use the calibration described. Also, although reference ladders that provide references are discussed, the calibration may be used on any resistor ladders.

In one embodiment, a master reference ladder 900 is part of coarse reference ladder 4-408. For example, master reference ladder may be a reference segment (unit resistor) that is selected as the subrange by coarse ADC 4-404. Master reference ladder 900 is a precise ladder. For example, master reference ladder 900 is built using larger valued unit resistors, $R_A$, where a voltage, $V_A$, is stable across the unit resistor $R_A$.

Fine reference ladder 4-414 includes a first fine reference ladder 902 and a second fine reference ladder 904. Second fine reference ladder 904 may be a separate part of or included in fine reference ladder 4-414. Second fine reference ladder 904 includes a unit resistor, $R_C$ and first fine reference ladder 902 includes a unit resistor, $R_B$. Unit resistor $R_B$ includes one or more unit resistors $R_C$.

Second fine reference ladder 904 is separated from first fine reference ladder 902 using a buffer component 906. For example, buffer component 906 may be one or more cascode devices. Buffer component 906 attenuates noise from a signal path that is from coarse reference ladder 4-408 to first fine reference ladder 902. Because first fine reference ladder 902 is in the signal path, it may produce noise. Buffer component 906 provides a high-impedance shielding from the signal path that may filter or attenuate the noise from first fine reference ladder 902.

Dynamic events occur at first fine reference ladder 902 that may cause the noise. For example, the voltage $V_B$ may be dynamically changing. In one example, as different subranges are selected in fine reference ladder 4-414, different voltage levels are across first fine reference ladder 902. In contrast, the voltage $V_C$ is not changing and second reference ladder 904 is quiet compared to first reference ladder 902. Because of the shielding from buffer 906, the current through second fine reference ladder 904 is also almost quiescent and is isolated from dynamic events at first fine reference ladder 902 because any noise from the events is absorbed by buffer 906.

A calibrator 908 performs a calibration of voltages across second fine reference ladder 904 and master reference ladder 900. The quiet voltage across second fine reference ladder 904 can also be used to calibrate the voltage across first fine reference ladder 902. Using a quiet voltage instead of a noisy voltage provides a more accurate calibration. In one embodiment, calibrator 908 uses a low-offset, low speed calibration loop in the background to perform the calibration.

Calibrator 908 senses the voltage $V_C$ from second fine reference ladder 904 at a sense port 910. Also, calibrator 908 senses the voltage across the whole or a segment of first reference ladder 4-408 at a reference port 912. The voltage $V_A$ is a multiple $k_1$ of $V_C$, where $k_1$ is a constant. Calibrator 908 adjusts the current to adjust $V_C$ to be multiple $k_1$ of $V_A$. For example, the current may be adjusted using a current source 910.

First fine reference ladder 902 and second fine reference ladder 904 are matched together using a fixed ratio. For example, first reference ladder 902 is built using units of second fine reference ladder 904, or vice versa. If a unit resistor, $R_C$, is used in second fine reference ladder 904, first fine reference ladder 902 is built using multiple unit resistors of $R_C$.

By using multiple units of $R_C$, the voltage $V_B$ may be a fixed ratio of $V_A$. For example, the voltage $V_C$ is:

$$V_C = k_1 V_A$$

If first fine reference ladder 902 and second fine reference ladder 904 having good matching, then:

$$V_B = k_2 V_C = k_2 k_1 V_A = k_3 V_A.$$

Thus, $V_B$ is a fixed ratio of $V_A$, where $k_1$, $k_2$, and $k_3$ are constants.

Accordingly, first fine reference ladder 902 may be matched to coarse reference ladder 4-408 through the calibration. First fine reference ladder 902 and second fine reference ladder 904 may be implemented using different orientation and size resistors from coarse reference ladder 4-408. Also, matching is kept over all corners and long term drifts using background calibration without disturbing the signal path or having calibration affected by the signal path.

Figure 10:
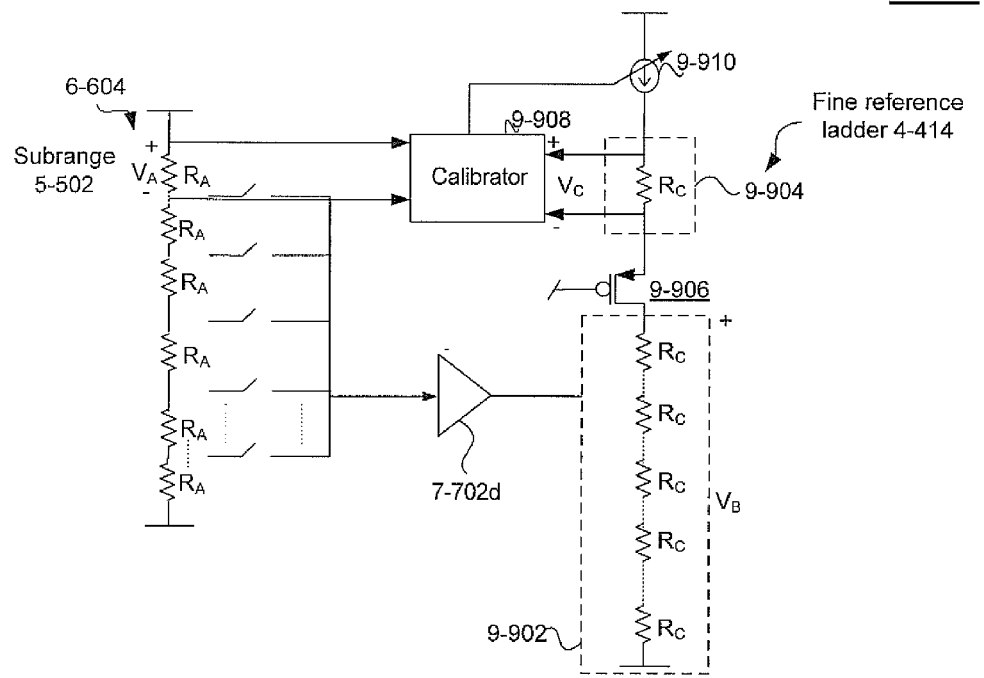
FIG. 10 shows a more detailed example of the ADC architecture according to one embodiment.

FIG. 10 shows a more detailed example of architecture 4-400 according to one embodiment. As shown, coarse DAC ladder 6-604 includes a plurality of unit resistors $R_A$. Second fine reference ladder 9-904 includes a unit resistor $R_C$ and first fine reference ladder 9-902 includes a plurality of unit resistors $R_C$. As discussed above, coarse ADC 4-404 receives an input voltage and selects a coarse reference. A subrange 5-502 in coarse DAC ladder 6-604 is selected to send the coarse reference to fine reference ladder 4-414 through buffer 7-702d. Buffer component 7-906 is coupled to a circuit such that it attenuates noise from first fine reference ladder 9-902. A current based on a voltage level of the coarse reference is sent to buffer 7-702. The voltage $V_A$ is a voltage drop across a unit resistor of coarse DAC ladder 6-604. The voltage $V_B$ is matched to a fixed ratio of the selected voltage $V_A$ using the calibration.

The voltage $V_A$ is sent to calibrator 9-908. Calibrator 9-908 also senses the voltage $V_C$ across second fine reference ladder 9-904. Calibrator 9-908 calibrates the current across fine reference ladder 4-414 using current source 9-910. As discussed above, the voltage $V_B$ is calibrated to a multiple $V_A$.

Figure 11:
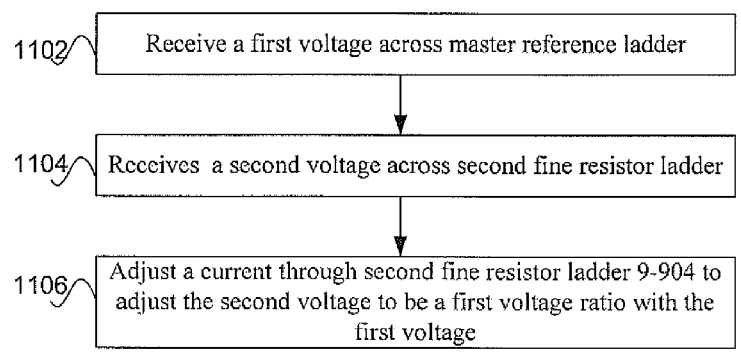
FIG. 11 depicts a simplified flowchart of a method for calibrating reference ladders according to one embodiment.

FIG. 11 depicts a simplified flowchart 1100 of a method for calibrating reference ladders according to one embodiment. At 1102, calibrator 9-908 receives a first voltage across master reference ladder 9-900. At 1104, calibrator 9-908 receives a second voltage across second fine reference ladder 9-904. The second voltage being received is buffered from disturbances in a third reference ladder.

At 1106, calibrator 9-908 adjusts a current through second fine reference ladder 9-904 to adjust the second voltage to be a first voltage ratio with the first voltage. The adjustment of the current adjusts a third voltage across first fine reference ladder 9-902 to be a second voltage ratio of the first voltage to the third voltage.

The use of the calibration is described in co-pending U.S. patent application Ser. No. 12/684,773 entitled "Current Sensing and Background Calibration to Match Two Resistor Ladders", filed concurrently, the contents of which is incorporated herein in its entirety for all purposes.

Reference Precharge

Referring back to FIG. 4, in one embodiment, a pre-charge of the voltage level at the output of switch matrix 410 is provided. The voltage level is pre-charged to a level of the input voltage. This allows the movement of the voltage at the output of switch matrix 410 to be performed more quickly. For example, the previous voltage level at the output of switch matrix 410 may be the voltage of the last analog input sample. The voltage level needs to be moved from the previous voltage level to the coarse reference selected by coarse ADC 404. For example, the coarse reference selected by coarse ADC 404 is the input voltage plus a quantization error $E_q$. The quantization error $E_q$ is the error from the closest digital code that approximates the input voltage.

A time period is taken where coarse ADC 404 is making the coarse decision. During this time period, the voltage level at the output of switch matrix 410 may be pre-charged to the input voltage ($V_{in}$). When the coarse decision is made, the voltage only needs to be changed to $V_{in}+E_q$. For example, the selected coarse reference is a voltage that is for a subrange that includes input voltage. Thus, if it is known the output of switch matrix 410 will be around $V_{in}+E_q$, the output of switch matrix 410 may be pre-charged to the input voltage $V_{in}$. The adjusting of the input voltage $V_{in}$ may be performed faster because adjusting an $E_q$ amount is a much smaller adjustment than from the previous sample's voltage level.

As shown in FIG. 4, a switch 424 is provided to allow the precharge of the output of switch matrix 4-410. Switch 424 may be closed to precharge the output of switch matrix 410 while coarse ADC 404 is making the coarse decision. When the coarse decision is made, switch 424 is opened to allow the output of switch matrix 410 to settle to $V_{in}+E_q$. In this case, a switch in switch matrix 410 is closed and the coarse reference is sent to buffer 4-412.

FIG. 7 also shows the precharge according to one embodiment. As shown, switch 4-424 is used to precharge output lines of coarse DAC 6-604. When coarse ADC is making the coarse decision, switch 4-424 may be closed and switches 708 may be open. This allows input lines 710 to be precharged to the input voltage $V_{in}$. In one embodiment, all input lines 710 are precharged. Thus, when the coarse reference is selected, the selected input line 710 is precharged. When the coarse decision is made, a switch 708 is closed to send the coarse reference to fine reference ladder 4-414. Also, switch 4-424 is opened to allow the selected input line 710 to settle to $V_{in}+E_q$.

Figure 12:
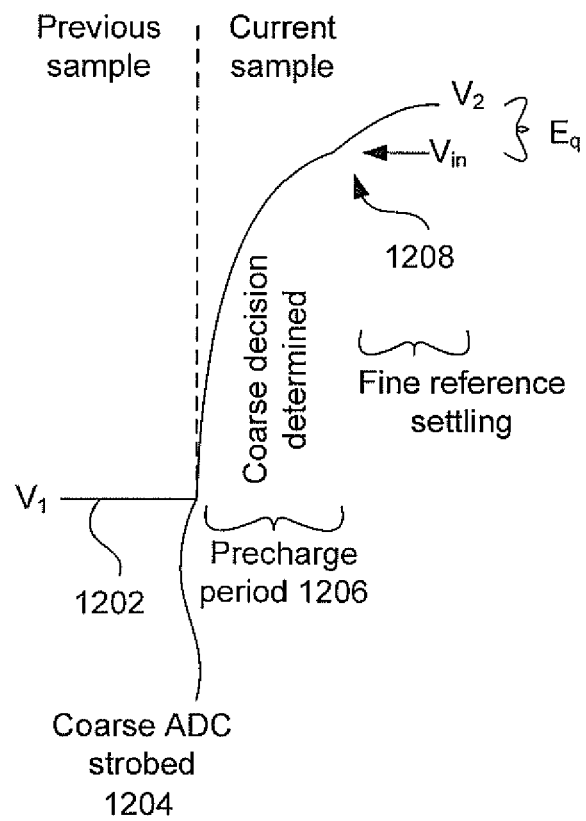
FIG. 12 depicts a waveform showing the pre-charge of an output of a switch matrix according to one embodiment.

FIG. 12 depicts a waveform showing the pre-charge of an output of switch matrix 4-410 according to one embodiment. At 1202, the voltage at the output of switch matrix 4-410 is $V_1$. This is the voltage of the previous input voltage sample. At 1204, coarse ADC 4-404 is strobed. At this point, coarse ADC 4-404 may start to make a coarse decision. For example, at 1206, coarse ADC 4-404 performs a comparison of the input voltage and the plurality of coarse references. At 1208, the first digital code is determined based on the comparison. The first digital code is used to select a switch in switch matrix 4-410.

The output of switch matrix 4-410 is pre-charged during a period at 1206. When a switch is selected, instead of the voltage at the output of switch matrix 4-410 being at $V_1$, the voltage is substantially around V. The voltage then needs to settle at the coarse reference of the input voltage $V_{in}$ plus the coarse quantization error $E_q$.

The use of the pre-charge is described in more detail in co-pending U.S. patent application Ser. No. 12/684,760 entitled "Reference Pre-Charging for Two-Step Subranging ADC Architecture", filed concurrently, the contents of which is incorporated herein in its entirety for all purposes.

Method Using Particular Embodiments

Figure 13:
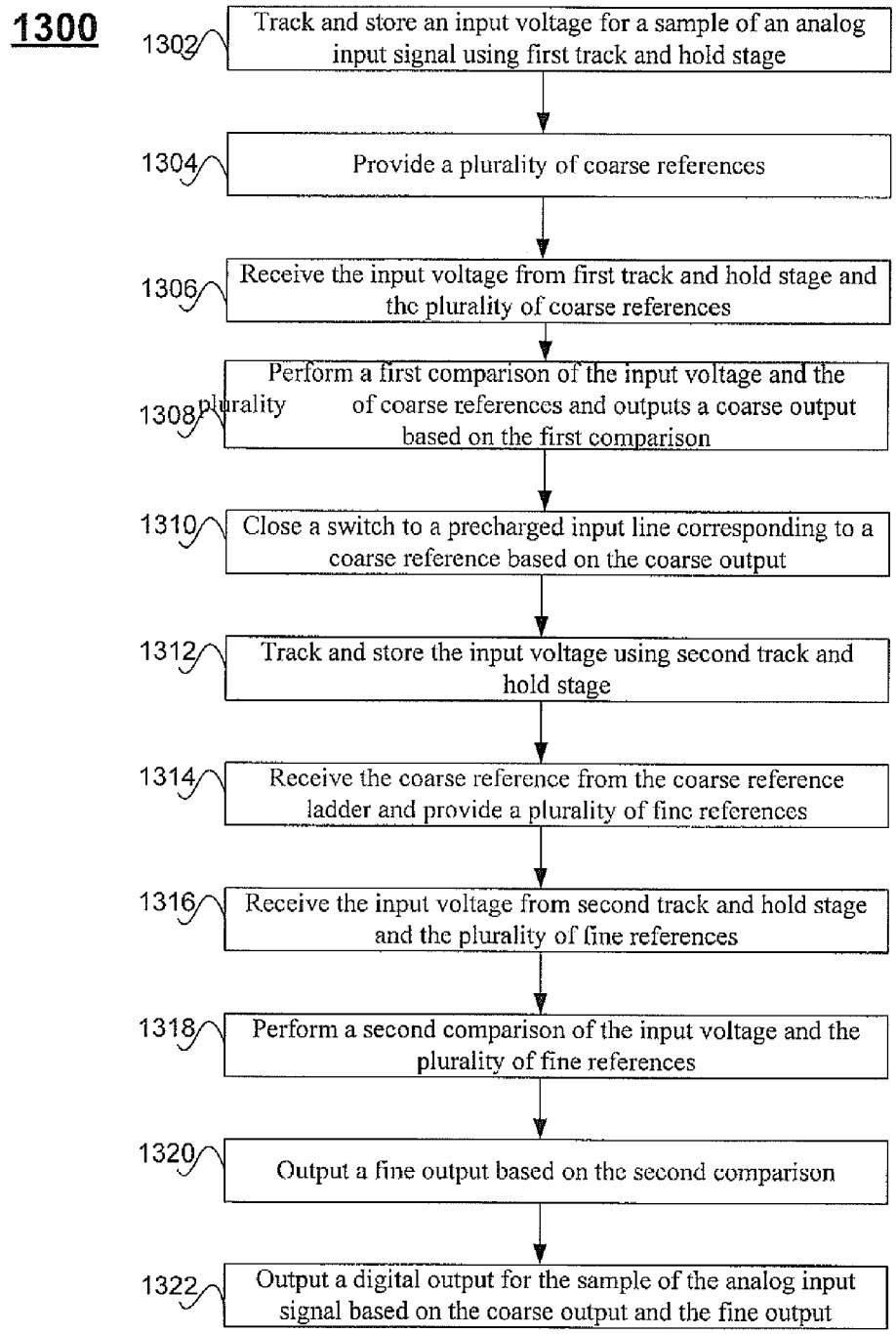
FIG. 13 depicts a simplified flowchart of a method for converting an analog input signal to a digital output signal according to one embodiment.

FIG. 13 depicts a simplified flowchart 1300 of a method for converting an analog input signal to a digital output signal according to one embodiment. At 1302, first track and hold stage 4-402a tracks and stores an input voltage for a sample of an analog input signal. At 1304, coarse reference ladder 4-408 provides a plurality of coarse references. In one embodiment, coarse reference ladder 4-408 includes first coarse ADC reference ladder 6-602 and second coarse reference ladder 6-604.

At 1306, coarse ADC 4-404 receives the input voltage from first track and hold stage 4-402a and the plurality of coarse references. At 1308, coarse ADC 4-404 performs a first comparison of the input voltage and the plurality of coarse references and outputs a coarse output based on the first comparison. At 1310, switch matrix 4-410 closes a switch corresponding to a coarse reference based on the coarse output. An input line has been precharged to the input voltage.

At 1312, second track and hold stage 402b tracks and stores the input voltage. At 1314, fine reference ladder 4-414 receives the coarse reference from the coarse reference ladder and provides a plurality of fine references. The plurality of fine references are determined based on the coarse reference. At 1316, fine ADC 4-416 receives the input voltage from second track and hold stage 4-402b and the plurality of fine references. At 1318, fine ADC 4-416 performs a second comparison of the input voltage and the plurality of fine references. At 1320, fine ADC 4-416 outputs a fine output based on the second comparison. At 1322, a digital output is output for the sample of the analog input signal based on the coarse output and the fine output.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A circuit comprising:
a first reference ladder configured to provide a plurality of first reference voltages via a plurality of first taps;
a selection circuit connected to the plurality of first taps, wherein the selection circuit is configured to select one of the plurality of first reference voltages;
a second reference ladder configured to, based on the selected one of the plurality of first reference voltages, provide a plurality of second reference voltages via a plurality of second taps;
a first analog to digital converter configured to (i) receive a first version of an analog input signal, and (ii) convert the first version of the analog input signal to a first digital signal; wherein the first reference ladder is separate from the first analog to digital converter;
a second analog to digital converter connected to the plurality of second taps, wherein the second analog to digital converter is configured to (i) receive a second version of the analog input signal, and (ii) based on the plurality of second reference voltages, convert the second version of the analog input signal to a second digital signal; and
a summer configured to generate a digital output signal based on (i) the first digital signal, and (ii) the second digital signal.

2. The circuit of claim 1, further comprising a line connected between the selection circuit and the second reference ladder, wherein:
the selection circuit is configured to select the one of the plurality of first reference voltages via a switch;
the switch is configured to connect the first tap, of the first reference ladder and corresponding to the selected one of the plurality of first reference voltages, to the second reference ladder; and
the line is charged based on the analog input signal and prior to the switch connecting the first tap of the selected one of the plurality of first reference voltages to the second reference ladder.

3. The circuit of claim 1, further comprising:
a first encoder configured to encode the first digital signal; and
a second encoder configured to encode the second digital signal,
wherein the summer is configured to sum an output of the first encoder and an output of the second encoder to generate the digital output signal.

4. The circuit of claim 1, wherein the first reference ladder is free of loading from comparators in the first analog to digital converter.

5. The circuit of claim 1, further comprising a third reference ladder, wherein:
the third reference ladder is configured to provide a plurality of third reference voltages via a plurality of third taps; and
the first analog to digital converter is configured to, based on the plurality of third reference voltages, convert the first version of the analog input signal to the first digital signal.

6. The circuit of claim 5, wherein:
the first reference ladder comprises a first plurality of resistances;
the third reference ladder comprises a second plurality of resistances; and
an impedance of one of the first plurality of resistances is less than an impedance of one of the second plurality of resistances.

7. The circuit of claim 6, wherein an impedance of each of the first plurality of resistances is less than impedances of the second plurality of resistances.

8. The circuit of claim 1, wherein:
the second reference ladder comprises a first resistance, a buffer and a plurality of resistances;
the buffer is connected between (i) the first resistance and (ii) the plurality of resistances; and
the buffer is configured to shield the first resistance by attenuating noise from either the first reference ladder or the plurality of resistances.

9. The circuit of claim 8, further comprising a calibrator configured to, based on a first voltage across at least a portion of the first reference ladder and a second voltage across the first resistance, calibrate (i) a third voltage across the first reference ladder, and (ii) a fourth voltage across the second reference ladder.

10. The circuit of claim 8, further comprising a calibrator configured to, based on a first voltage across at least a portion of the first reference ladder and a second voltage across the first resistance, calibrate an amount of current supplied to the second reference ladder.

11. A method of operating a circuit, wherein the circuit includes a first reference ladder, a second reference ladder, a first analog to digital converter, and a second analog to digital converter, wherein the first reference ladder is separate from the first analog to digital converter, the method comprising:
providing a plurality of first reference voltages via the first reference ladder;
selecting one of the plurality of first reference voltages;
based on the selected one of the plurality of first reference voltages, providing a plurality of second reference voltages via the second reference ladder;
receiving a first version of an analog input signal at the first analog to digital converter;
converting the first version of the analog input signal to a first digital signal;
receiving a second version of the analog input signal at the second analog to digital converter;
based on the plurality of second reference voltages, converting the second version of the analog input signal to a second digital signal; and
generating a digital output signal based on (i) the first digital signal, and (ii) the second digital signal.

12. The method of claim 11, further comprising charging a line, connected between a switch and the second reference ladder, based on the analog input signal and prior to connecting a tap of the first reference ladder to the second reference ladder, wherein:
the tap of the first reference ladder corresponds to the selected one of the plurality of first reference voltages;
the one of the plurality of first reference voltages is selected via the switch; and
the tap of the selected one of the plurality of first reference voltages is connected to the second reference ladder via the switch.

13. The method of claim 11, further comprising:
encoding the first digital signal; and
encoding the second digital signal, wherein the digital output signal is generated based on (i) the encoded first digital signal, and (ii) the encoded second digital signal.

14. The method of claim 11, wherein the first reference ladder is separate from the first analog to digital converter such that the first reference ladder is free of loading from comparators in the first analog to digital converter.

15. The method of claim 11, further comprising, based on a plurality of third reference voltages provided via a third reference ladder, converting the first version of the analog input signal to the first digital signal.

16. The method of claim 15, wherein:
the first reference ladder comprises a first plurality of resistances;
the third reference ladder comprises a second plurality of resistances; and
an impedance of one of the first plurality of resistances is less than an impedance of one of the second plurality of resistances.

17. The method of claim 16, wherein an impedance of each of the first plurality of resistances is less than impedances of the second plurality of resistances.

18. The method of claim 11, further comprising shielding a first resistance of the second reference ladder via a buffer by attenuating noise from either (i) the first reference ladder, or (ii) a plurality of resistances of the first reference ladder.

19. The method of claim 18, further comprising, based on a first voltage across at least a portion of the first reference ladder and a second voltage across the first resistance, calibrating (i) a third voltage across the first reference ladder, and (ii) a fourth voltage across the second reference ladder.

20. The method of claim 18, further comprising, based on a first voltage across at least a portion of the first reference ladder and a second voltage across the first resistance, calibrating an amount of current supplied to the second reference ladder.

* * * * *